US010054691B1

(12) United States Patent
Wrbanek et al.

(10) Patent No.: US 10,054,691 B1
(45) Date of Patent: Aug. 21, 2018

(54) FAST, LARGE AREA, WIDE BAND GAP UV PHOTODETECTOR FOR CHERENKOV LIGHT DETECTION

(71) Applicant: The United States of America as represented by the Administrator of the National Aeronautics and Space Administration, Washington, DC (US)

(72) Inventors: John D. Wrbanek, Sheffield Village, OH (US); Susan Wrbanek, Sheffield Village, OH (US)

(73) Assignee: The United States of America as Represented by the Admin of National Aeronautics and Space Administration, Washington, DC (US)

( * ) Notice: Subject to any disclaimer, the term of this patent is extended or adjusted under 35 U.S.C. 154(b) by 742 days.

(21) Appl. No.: 14/193,024

(22) Filed: Feb. 28, 2014

Related U.S. Application Data

(60) Provisional application No. 61/771,163, filed on Mar. 1, 2013.

(51) Int. Cl.
| | |
|---|---|
| *G01T 1/22* | (2006.01) |
| *H01L 31/0296* | (2006.01) |
| *H01L 31/0224* | (2006.01) |
| *G01J 1/42* | (2006.01) |
| *G01T 1/24* | (2006.01) |

(52) U.S. Cl.
CPC ............... *G01T 1/22* (2013.01); *G01J 1/429* (2013.01); *G01T 1/24* (2013.01); *H01L 31/0224* (2013.01); *H01L 31/0296* (2013.01)

(58) Field of Classification Search
CPC ............... G01T 1/22; G01T 1/24; G01J 1/429
See application file for complete search history.

(56) References Cited

U.S. PATENT DOCUMENTS

| | | | |
|---|---|---|---|
| 3,717,767 A | 2/1973 | Gold et al. | |
| 5,847,397 A * | 12/1998 | Moustakas | ............... 250/370.06 |
| 6,011,265 A | 1/2000 | Sauli | |
| 7,453,987 B1 | 11/2008 | Richardson | |
| 7,872,750 B1 * | 1/2011 | Wrbanek et al. | ............. 356/336 |
| 8,119,979 B2 | 2/2012 | Fleming et al. | |
| 8,159,669 B2 | 4/2012 | Wrbanek et al. | |
| 8,344,335 B2 | 1/2013 | Fleming et al. | |
| 2002/0192361 A1 * | 12/2002 | Chang et al. | ................... 427/58 |
| 2003/0121764 A1 * | 7/2003 | Yang | ..................... B82Y 10/00 |
| | | | 200/262 |

(Continued)

*Primary Examiner* — Hugh H Maupin
(74) *Attorney, Agent, or Firm* — Robert H. Earp, III; William M. Johnson

(57) ABSTRACT

A solid-state radiation detector includes a pattern of conductive metal on a zinc oxide substrate. The pattern provides an arrangement of interdigitated electrode fingers. The wide band gap substrate is sensitive to UV light, which can cause a conductivity change in the substrate. The electrode fingers are configured to sense a difference in substrate conductivity resulting from UV light. The detector has a fast response time, which enables it to detect Cherenkov light. The compact detector provides savings on size, weight, and required power. Thus, the solid-state detector can be used to replace photomultiplier tubes in Cherenkov detectors. The features of the novel detector allow for an improved system to detect and monitor UV radiation, especially during deep space missions.

20 Claims, 7 Drawing Sheets

(56) References Cited

U.S. PATENT DOCUMENTS

| | | |
|---|---|---|
| 2005/0116263 A1* | 6/2005 | Lu ........................ C12Q 1/6825 |
| | | 257/252 |
| 2005/0145970 A1* | 7/2005 | Lu et al. ........................ 257/449 |
| 2007/0096031 A1 | 5/2007 | Meier et al. |
| 2010/0265078 A1 | 10/2010 | Friedman |
| 2011/0079728 A1 | 4/2011 | Garcia et al. |
| 2012/0153860 A1* | 6/2012 | Wang ..................... B82Y 40/00 |
| | | 315/291 |
| 2013/0032722 A1 | 2/2013 | Szupryczynski et al. |
| 2013/0068956 A1 | 3/2013 | Friedman |

* cited by examiner

| Diode | ZnO (per Volt bias) | SiC (-10V bias) | GaP (-10V bias) |
|---|---|---|---|
| Detector Area | 2 mm² | 0.96 mm² | 4.8 mm² |
| Average Dark Current | 1.8 ± 0.2 nAmps | < 50 pAmps | 100 ± 20 pAmps |
| Relative Output to Hg lamp (254 nm) | 58.7 ± 3.8 | 0.196 ± 0.029 | 1 |
| Relative Output to LED source (370 nm) | 14.99 ± 5.6 | 0.041 ± 0.0024 | 1 |
| Relative Output to Hg lamp (254 nm) per unit area (mm⁻²) | 14.09 ± 0.91 | 0.981 ± 0.147 | 1 |
| Relative Output to LED source (370 nm) per unit area (mm⁻²) | 3.6 ± 1.3 | 0.207 ± 0.012 | 1 |

Figure 6

| Detector | Active Area | Mass | Volume | Voltage | Dark Current | Minimum Power Draw | Amplitude Signal to Noise | Maximum Operating Temperature | Temperature Sensitivity of Dark Current |
|---|---|---|---|---|---|---|---|---|---|
| Cherenkov Detector: | | | | | | | | | |
| PMT | 20 cm² | 170 g | 180 cm³ | 1000 V | 5 nA | 5 μW | 4x10³ | 50°C | 0.2%/°C |
| ZnO | 2 mm² | 11 g | 0.80 cm³ | 10 V | 5 nA | 0.05 μW | 2x10⁴ | 125°C | 0.05%/°C |

Figure 7

FAST, LARGE AREA, WIDE BAND GAP UV PHOTODETECTOR FOR CHERENKOV LIGHT DETECTION

CROSS REFERENCE TO RELATED APPLICATION

This application claims benefit pursuant to 35 U.S.C. § 119(e) of U.S. provisional application 61/771,163 filed Mar. 1, 2013, which is herein incorporated by reference in its entirety.

ORIGIN OF THE INVENTION

The invention described herein was made by employees of the United States Government and may be manufactured and used by or for the Government for Government purposes without the payment of any royalties thereon or therefore.

The invention described herein was also made in the performance of work under a NASA contract and is subject to the provisions of Section 305 of the National Aeronautics and Space Act, Public Law 111-314, § 3 (124 Stat. 3330, 51 U.S.C. Chapter 201).

BACKGROUND OF THE INVENTION

Field of the Invention

The present invention relates generally to particle detectors, and particularly radiation particle detectors.

Description of the Related Art

There is a need for new instrumentation and sensing capabilities to collect and process scientific data. Space radiation can be a constant and significant hazard to a crew and/or equipment involved in space missions. The timely and accurate detection of space radiation particles can be vital to the viability of manned and unmanned deep space missions to High Earth Orbit (HEO), Near Earth Orbit (NEO), Lunar and Martian orbits and surfaces, and outer planetary systems, as well as to improvements to high altitude aircraft safety.

SUMMARY OF THE INVENTION

An exemplary embodiment of the invention includes a radiation detector.

An exemplary embodiment includes an ultraviolet (UV) light detector.

An exemplary embodiment includes a solid state UV light detector.

An exemplary embodiment includes a solid state UV light detector that is fast and has a large sensitive area, and can be used as a Cherenkov light detector.

An exemplary embodiment includes a solid state UV light detector device that can replace the role of photomultiplier tubes in Cherenkov detectors, while also providing savings on size, weight, and required power.

An exemplary embodiment includes a solid state UV light detector that is based on a wide band gap semiconductor comprising zinc oxide (ZnO).

Another exemplary embodiment comprises a detector system that includes a UV light detector that is part of a bridge circuit, where the detector system can detect small, fast pulses of UV light like Cherenkov light.

BRIEF DESCRIPTION OF THE DRAWINGS

FIG. 6 is a table that shows relative measured sensitivity of an exemplary detector substrate material in comparison to some other detector materials.

FIG. 7 is a table that compares attributes provided by a detector of an exemplary embodiment and by a photomultiplier tube type of detector.

DETAILED DESCRIPTION OF EXEMPLARY EMBODIMENT(S)

Figure 1:
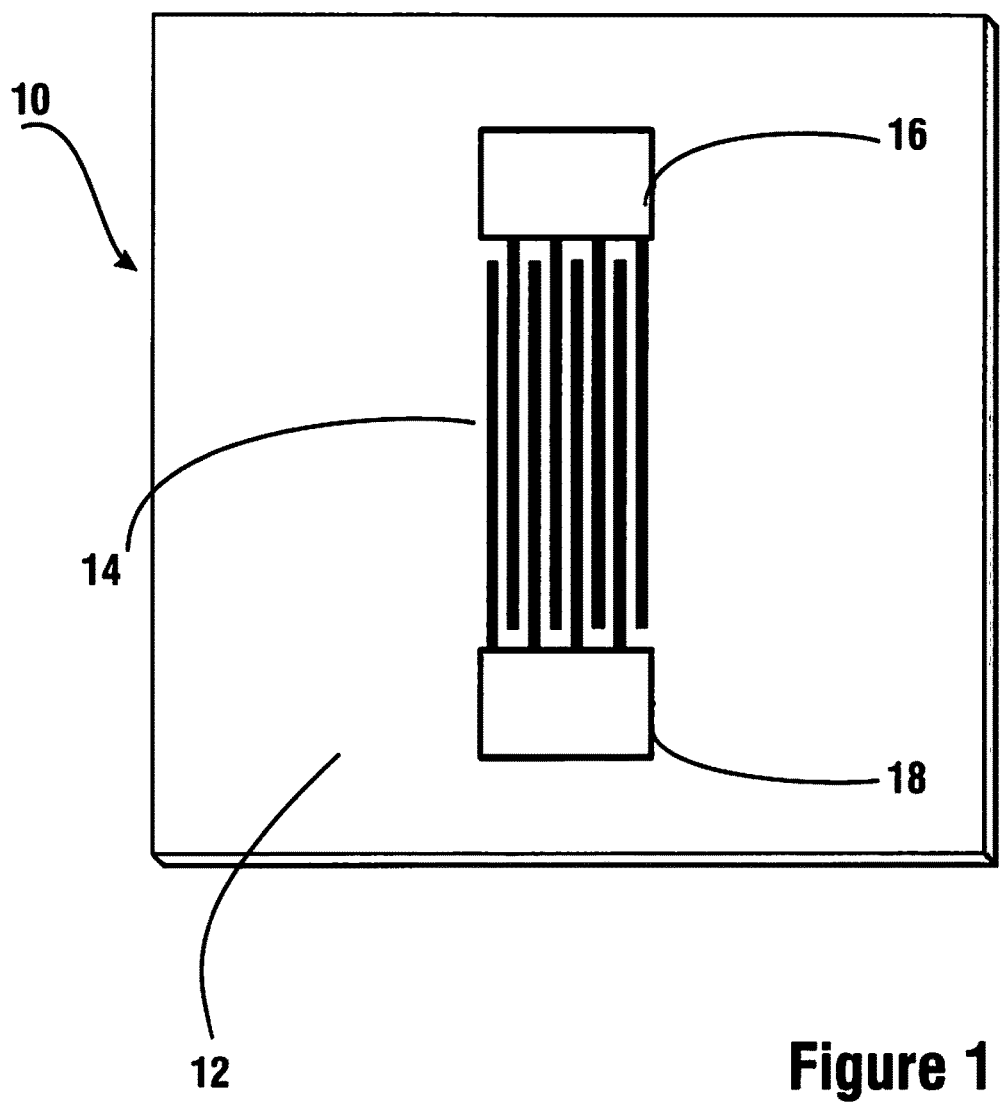
FIG. 1 is a schematic representation of an exemplary embodiment of UV photodetector of an exemplary embodiment of the present invention.

It will be readily understood that the features of exemplary embodiments, as generally described and illustrated in the Figures herein, may be arranged and designed in a wide variety of different configurations. Thus, the following detailed description of the exemplary embodiments of apparatus and method, as represented in the attached Figures, is not intended to limit the scope of the invention as claimed, but is merely representative of selected exemplary embodiments that implement the principles described herein.

The features, structures, and/or characteristics of the arrangements described throughout this specification may be combined in any suitable manner in one or more embodiments. For example, the usage of "certain embodiments," "some embodiments," "other embodiments," or other similar language, throughout this specification refers to the fact that a particular feature, structure, or characteristic described in connection with one embodiment may be included in at least one other embodiment or arrangement. Thus, appearances of the phrases "in certain embodiments," "in some embodiments," "in other embodiments," or other similar language, throughout this specification do not necessarily all refer to the same embodiment or group of embodiments, and that the described features, structures, and/or characteristics may be combined in any suitable manner in one or more embodiments or arrangements.

A Cherenkov detector is a particle detector utilizing the velocity-dependent threshold energy of Cherenkov radiation. Cherenkov radiation is electromagnetic radiation emitted when a charged particle passes through a dielectric medium at a speed greater than the speed of light in that medium. Where the velocity of a charged particle is greater than the phase velocity of electromagnetic fields in a medium with an index of refraction greater than 1, the charged particle may emit energy per unit of a path length due to its electric field reacting to the dielectric polarization of the medium. The effect was first reported by P. A. Cherenkov in 1934, and bears his name. A Cherenkov detector allows for the discrimination between a lesser charged particle (which radiates less) and a more highly charged particle (which radiates more). Further discussion regarding the structure, operation, and usage of UV detectors, such as a Cherenkov detector, can be found in U.S. Pat. No. 7,872,750, the disclosure of which is incorporated herein by reference in its entirety.

Some spacecraft-based radiation detection systems use Cherenkov detectors which rely on photomultiplier tubes. These photomultiplier tubes are vacuum tube based detectors which need special packaging and care to survive launch conditions. They also operate with relatively large voltages. The result is a radiation detector that requires large mass, volume, and supporting hardware.

Furthermore, photodiodes that are based on wide band gap materials for detecting UV are currently limited by reaction time and/or to small detector areas. Commercial UV photodiodes are also limited by being mainly based on three materials: gallium nitride (GaN); gallium phosphide (GaP); and silicon carbide (SiC). For each of these materials there are tradeoffs between speed and wavelength bandwidth sensitivity. Thus, due to limited resources available for power, payload weight, and other factors, current Cherenkov detectors with photomultiplier tubes may be unsuitable for the challenges of future manned and unmanned space missions.

An exemplary embodiment that utilizes the principles described herein includes a UV detector which comprises miniaturized and integrated instrumentation features which address the challenges of these future space missions. The exemplary detector can be operated as a Cherenkov light detector.

An exemplary embodiment comprises a robust compact detector that allows future instrumentation packages to have more options in satisfying specific mission goals. The exemplary embodiment also takes into consideration the technology limiters related to detector size, noise floor, and detection geometry. The exemplary embodiment provides solutions for these limitations by providing a low noise, solid state detector.

The exemplary detector arrangement also allows for improved detection geometry. For example, the exemplary detector may be used in a spherical detector system. Such a spherical detector system provides a geometry that enables the measurement of high atomic number and energy (HZE) ions from almost any direction.

The exemplary detector comprises a solid state ultraviolet (UV) photo-detector that is fast enough (2 ns response time or better) to detect the shockwave of Cherenkov light emitted as the ions pass through a radiator (e.g., quartz, sapphire, acrylic, etc.). That is, the detector response time is within 2 nano seconds (e.g., ≤2 ns). The detector is small enough to fit in a detector system structure, but also has an active area large enough to capture enough Cherenkov light for a meaningful measurement. Thus, in an exemplary embodiment, the solid-state detector is used to replace the role of photomultiplier tubes used in previous types of UV detectors.

The exemplary UV detector that utilizes the principles described herein can be fabricated on a ZnO substrate. For example, in an exemplary process of making the UV detector, the detector is fabricated on a commercially available, bulk, single-crystal, undoped, ZnO semiconductor substrate. Patterns of interdigitated finger electrodes and contact pads are arc patterned onto the substrate via photolithography. The electrodes and contact pads in an exemplary arrangement are formed by sputtered high conductive metal, such as silver and/or platinum.

In the exemplary detector, the single-crystal ZnO comprises alternating planes of zinc and oxygen ions. This ionic bonding allows the material to be equally reactive to acids and bases. The single crystal undoped ZnO comprises a crystal form having a 0001 orientation.

The exemplary radiation detector arrangement also includes the feature of utilizing at least one wide band gap (WBG) solid-state material (e.g., a semiconductor). The wide band gap is greater than 1.7 eV. The exemplary WBG semiconductor utilizing ZnO or materials with similar properties provides advantages of low ionization energy, high electron mobility, high density, and structural rigidity. Also, as a direct benefit for space applications, the WBG semiconductor has negligible sensitivity to temperature changes.

An exemplary sensor arrangement that utilizes ZnO for the exemplary semiconductor substrate is not flammable below 1436° C. Furthermore, at temperatures over 800° C., the ZnO becomes non-stoichiometric, losing oxygen and decomposing completely at 1975° C.

FIG. 1 shows an exemplary UV detector 10. The detector includes a ZnO substrate 12. Sputtered on the substrate 12 is at least one pattern of interdigitated electrode fingers 14 which extend from opposite contact pads 16, 18. For sake of clarity, only four electrode fingers 14 are shown with respect to each contact pad. However, it should be understood that in other embodiments greater or fewer electrode fingers can be used. Furthermore, in alternative embodiments the electrode fingers can also be non linear or have other configurations.

As can be seen in the arrangement of FIG. 1, a first electrode includes a first set of fingers, and a second electrode includes a second set of fingers. The fingers from the second set alternate in parallel with fingers of the first set, which forms interdigitated electrode fingers 14. The first set of fingers extend from the first contact pad 16, and the second set of fingers extend from the second contact pad 18. The first electrode, the second electrode, the first contact pad 16, and the second contact pad 18 in an exemplary arrangement are formed by at least one pattern of conductive metal that is applied by being sputtered onto and engaged with the substrate 12. The wide band gap substrate 12 is sensitive to UV light, which can cause a conductivity change in the substrate. The interdigitated electrode fingers 14 are spaced relative to each other in a manner that allows them to sense a difference (change) in substrate conductivity (or resistance) resulting from UV light that contacts the substrate in the exposed areas between the electrode fingers. The exemplary sensing ability allows the detector to have a response time ≤2 nano seconds.

In an exemplary embodiment, the detector can be operated as part of a detector system. The detector system can comprise a sensor component and a measurement component. The ZnO substrate detector can operate as the sensor component. The measurement component is operable to detect a change in at least one of voltage or resistance between the contact pads, resulting from the sensed change in substrate conductivity. For example, the detector can be operated as a resistive sensor, like in a strain gauge or a resistance temperature detector (RID). The resistive sensor can be supplied voltage/current, resulting in current/voltage being monitored for changes and detection purposes.

Figure 2:
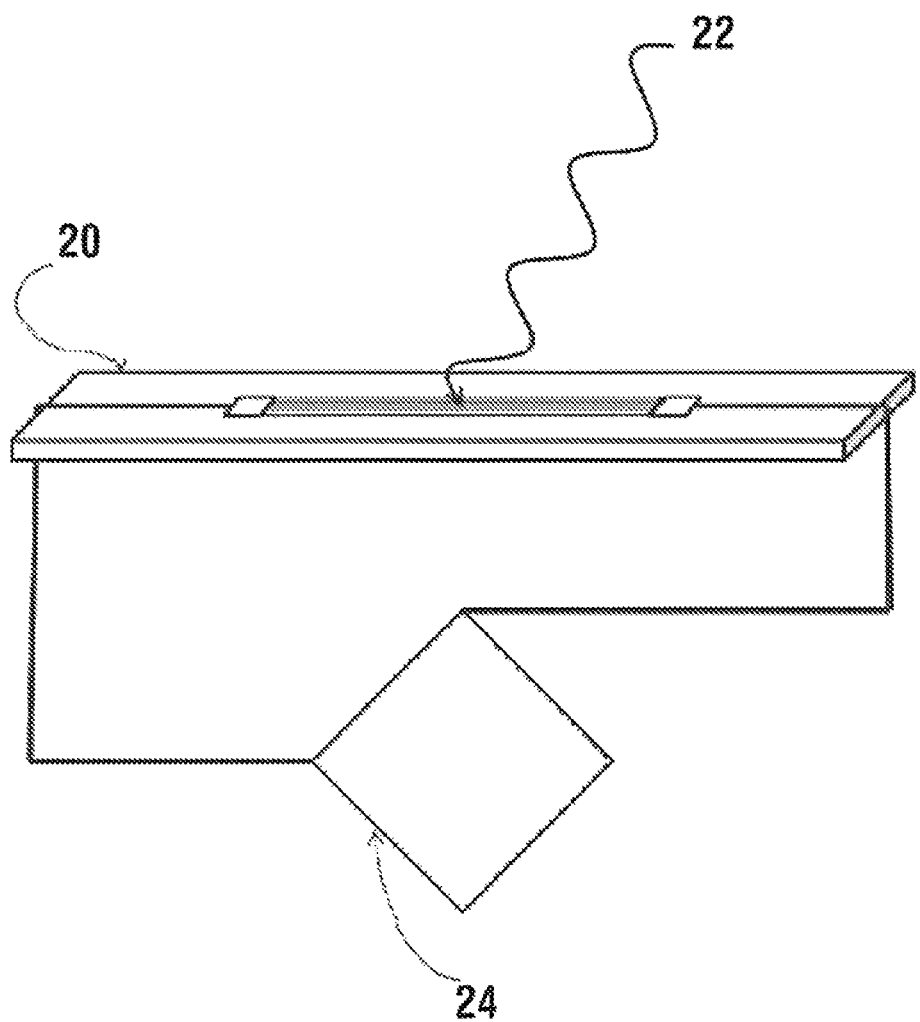
FIG. 2 illustrates an exemplary embodiment of a detector system that comprises a two wire/quarter bridge configuration.

In an exemplary embodiment of the detector system, the detector is operated as part of a circuit. For example, the detector can be operated as a resistive sensor as part of a bridge circuit. The bridge circuit allows for measurement of a difference in at least one of voltage drop or change in resistance resulting from the sensed change in substrate conductivity FIG. 2 shows an exemplary detector system in which an exemplary UV detector 20 can detect or sense a UV flash 22. The detector 20 can be similar to the detector 10 shown in FIG. 1. Detector 20 is connected to a UV light measurement component, such as a signal conditioner/readout 24. FIG. 2 provides an example of an exemplary UV detector 20 being used in a 2-wire/quarter bridge configuration.

The solid state photodetector arrangement shown in FIG. 2 is operable to detect UV light, including a Cherenkov light emission, having a duration of less than 2 ns. The sensor component includes interdigitated electrode fingers on a wide band gap photosensitive semiconductor. The semiconductor comprises a metal oxide configured to undergo a change in conductivity (e.g. resistance) responsive to exposure to UV light. An exemplary metal oxide comprises a substrate of single crystal undoped ZnO, which comprises alternating planes of zinc and oxygen ions.

The measurement component is electrically connected to the sensor component. The measurement component is operable to measure data associated with UV light sensed by the sensor component. An exemplary measurement component includes a circuit. An exemplary circuit comprises a bridge circuit. The bridge circuit allows for measurement of a difference corresponding to the change in resistance (sensed by the sensor component) responsive to exposure of the sensor to UV light.

Figure 3:
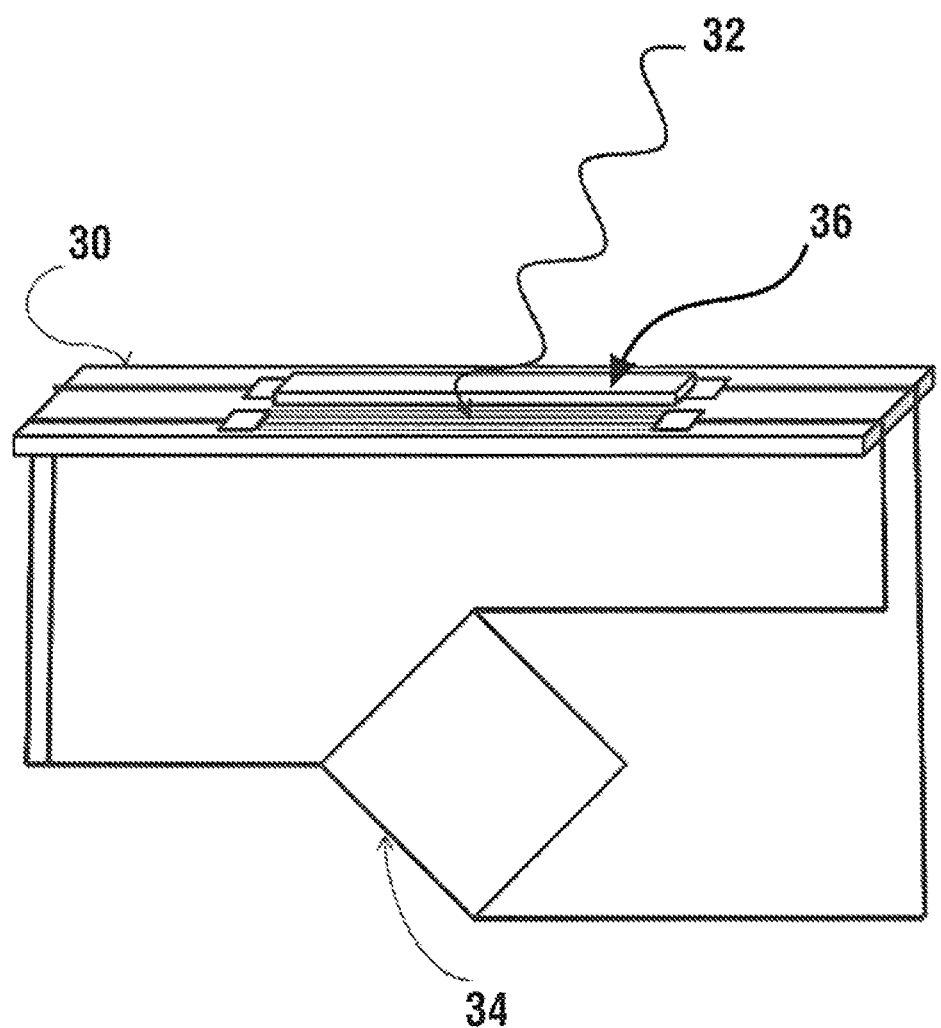
FIG. 3 illustrates an exemplary embodiment of a detector system that comprises a four wire/half bridge configuration.

FIG. 3 shows another exemplary detector system in which an exemplary UV detector 30 can detect a UV flash 32. The detector 30 comprises an arrangement of a pair of electrodes. In comparison to FIG. 1, the arrangement can comprise either a single ZnO substrate 12 or dual ZnO substrates 12 positioned next to each other. Also shown is a signal conditioner/readout 34. FIG. 3 provides an example of an exemplary UV detector 20 being used in a 4-wire/half bridge configuration.

In the arrangement of FIG. 3 each electrode comprises two sets of electrode fingers which extend in alternating parallel alignment with each other. A first electrode is operated as an active resistor while the other (adjacent) electrode is operated as a dummy or reference resistor. The dummy resistor can be used to increase detection sensitivity by providing a base line. The dummy resistor comprises another interdigitated finger electrode pattern that is sputtered in an adjacent parallel position on the same ZnO substrate material. However, the dummy resistor is different in that it is coated with a UV blocking material 36. As a result the dummy resistor does not change conductivity due to UV radiation reaching the substrate in areas proximate to its electrode fingers. In operation a supplied voltage gets divided between the detector (resistor) and the dummy resistor. As discussed in further detail later, by measuring the difference of voltage drop of the detector and its parallel resistor, an accurate UV light measurement for the electrode that is exposed to UV radiation can be made.

Figure 4:
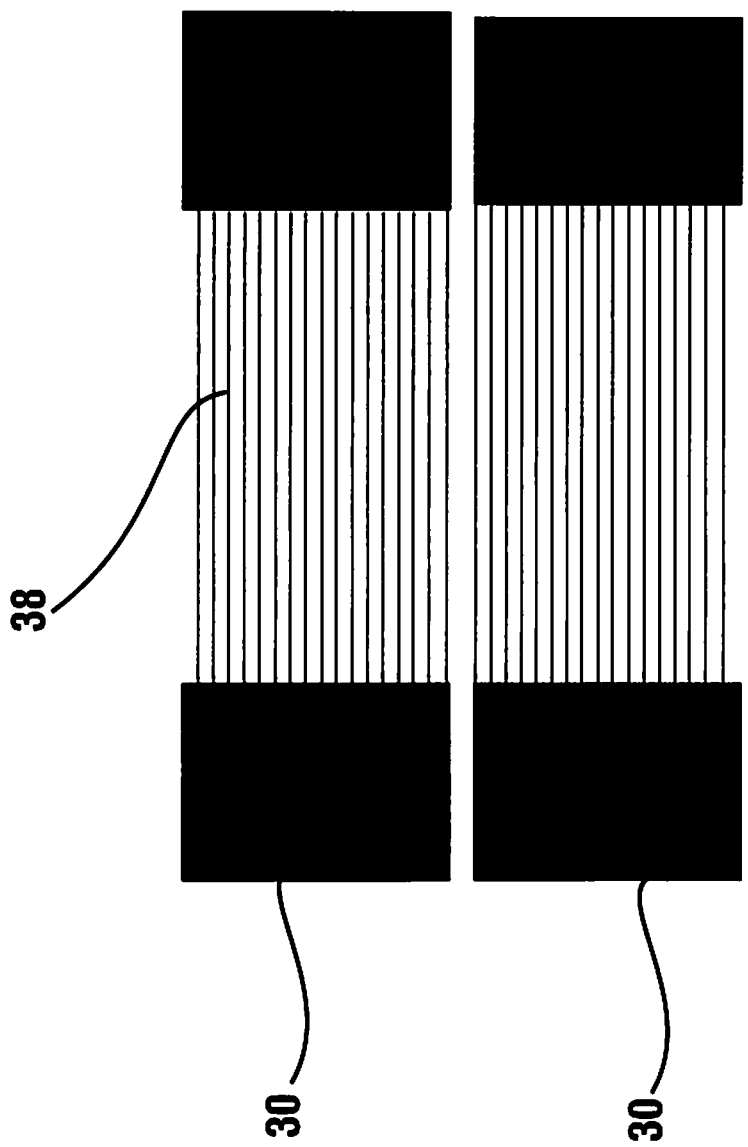
FIG. 4 illustrates a pair of adjacent detector substrate arrangements that are usable in the detector system of FIG. 3.

FIG. 4 shows a top view of a substrate portion of the exemplary detector system in FIG. 3. The substrate portion has formed thereon a detector 30 which comprises two side-by-side (separated) electrode arrangements, each with a plurality of fingers 38. Again in some arrangements, one of the electrodes can be a dummy electrode which is used to provide a reference value which is covered by UV blocking material.

In various embodiments, an exemplary detector system can be operated with a 2-wire, 4-wire, or 6-wire resistance monitoring arrangement in a quarter-bridge, half-bridge, or full-bridge circuit configuration. Again, a bridge amplifier or a resistance meter, such as a digital multi-meter, can be a part of an exemplary detector system. However, it should be understood that in other embodiments other configurations and/or devices can be used to provide (output) detector sensor readings and/or measurements.

During operation of the exemplary detector, when exposed to UV light (or any light of sufficient energy), the electrons in valence bands of the ZnO semiconductor absorb sufficient energy to jump into the conductive band, and freely move (drift) about the semiconductor. Unless defined by an electric field in the exemplary detector, the motions of these electrons will remain random, and will lose enough energy to fall back into a valence band. Thus, the electric field is applied to direct (control) the drift of these conductive electrons.

The addition of conductive electrons in the semiconductor, as a result of the absorption of UV light, causes a reduction in the resistance of the semiconductor. In the exemplary detector system, a difference which (directly) corresponds to this reduced resistance is sensed and measured.

Detection response time t can be determined from the equation:

$$t = d^2/\mu V \qquad \text{(Equation I)}.$$

In the Equation, d is the inter-digitated finger electrode spacing, μ is the electron mobility of the semiconductor, and V the applied voltage. That is, d can correspond to the (equal) spacing length between interdigitated fingers of the electrodes, μ can correspond to the electron mobility of the semiconductor substrate, and V can correspond to the voltage applied to the electrodes.

In an exemplary embodiment of a semiconductor material ZnO, the electron mobility μ is approximately 200 cm/(V·s) at 300K, varying with absolute temperature by an Arrhenius function such that the mobility is approximately 100 cm/(V·s) at 400K and 1000 cm/(V·s) at 160K.

As can be seen from Equation I, when there is a smaller electrode spacing d and/or a higher supplied voltage V, then there is a faster response time. Furthermore, the response time should be independent of the active area of the detector.

Experimentation results will now be discussed. An exemplary detector as previously described, was fabricated using commercially available bulk single-crystal undoped ZnO. On the ZnO substrate were interdigitated finger electrodes and contact pads that were pattered via photolithography and formed by sputtered silver. There was 20 μm spacing between the interdigital electrode fingers on the ZnO substrate. The active area was 1 mm by 2 mm (2 mm$^2$). From equation I, the detector was designed to have a response time of 1 nano second (ns) with 10 V bias voltage supplied.

Figure 5:
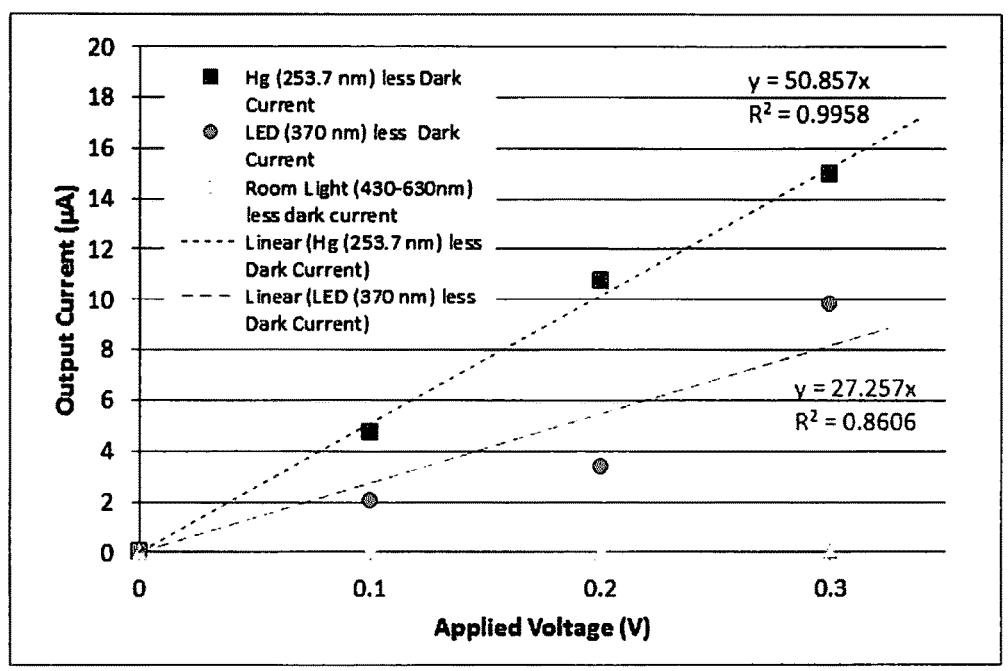
FIG. 5 illustrates results produced by an exemplary detector system based on UV light sources of Hg and LED.

FIG. 5 shows a data graph which demonstrates the exemplary detector's sensitivity to UV. The results showed the detector to be sensitive to UV light at 254 nm, and slightly less sensitive to UV light at 370 nm. The detector was not sensitive to room lighting (about 430-630 nm). The intensity of the 254 nm Hg light was estimated to be ¹/₁₀ of that of the 370 nm LED light. Thus, this intensity estimation indicates that the detector is about 70% more sensitive to the 254 nm light than to the 370 nm light. As can be appreciated, the exemplary detector provides excellent response time with general spectral sensitivity.

Again, the exemplary UV detector can function as a fast solid-state Cherenkov detector. Cherenkov light is a broad spectrum emission proportional to the inverse square of the wavelength, peaking in the extreme UV (wavelength <150 nm), which makes the lower wavelength sensitivity capabilities of the exemplary UV detector highly desirable.

Additional experimentation data is summarized in the Table I shown in FIG. 6. The table shows relative measured sensitivity of WBG UV detector substrate material ZnO in comparison to detector materials SiC and GaP. The table illustrates the sensitivity of the exemplary detector to UV light, especially in comparison to the SiC and GaP detectors, which were tested in parallel.

As previously noted, the exemplary UV detector, which is based on a ZnO substrate, uses less power than current UV detectors that rely on photomultiplier (PMT) tubes. Additional experimentation data is summarized in the Table II shown in FIG. 7. FIG. 7 shows the superior attributes provided by the exemplary ZnO detector when compared to a PMT type of detector. Note the circled portion of Table II. As can be seen, one result was that 100 times less power was used (i.e., 0.05 µW vs. 5 µW). Other favorable attributes can be seen in the signal to noise ratio, the operating temperature, and the sensitivity.

As can be appreciated, the features of the exemplary radiation detector allow for simplicity of design, yet provide a large UV detection area and a fast response time. Thus, the features meet the requirements necessary for detecting Cherenkov light in radiation detectors.

Again, an exemplary radiation detector comprises a UV photodetector that is operable to detect Cherenkov light. The photodetector includes a semiconductor substrate which comprises single crystal undoped ZnO. The ZnO comprises alternating planes of zinc and oxygen ions. The photodetector also includes interdigitated finger electrodes and contact pads, which are comprised of conductive metal that was sputtered or otherwise applied onto the ZnO substrate. The photodetector is configured to operate as a resistive sensor for a bridge circuit. The exemplary arrangement allows the photodetector to have a response time of ≤2 nano seconds. The response time can be expressed as $d^2/\mu V$, where d corresponds to spacing length between interdigitated fingers of the electrodes, µ corresponds to electron mobility of the substrate, and V corresponds to voltage applied to the electrodes. In some exemplary operations, the photodetector has a response time of ≤1 nano second.

The ZnO sensor portion of the exemplary radiation detector can be fabricated using a standard micro-fabrication processes. However, an exemplary radiation detector is fabricated without any doping (additional material) of the ZnO substrate, so as to allow extended use of the detector in space without (doping-caused) loss of sensitivity. Also, in the exemplary detector configuration, even though the response time is dependent on electrode spacing (as previously discussed), the wavelength is not. Thus, the exemplary features and configuration allow the detector to be fabricated to tolerances that are specific (targeted) to mission requirements.

As can be appreciated, the exemplary radiation detector includes features that provide many improvements that are desirable in instrumentation technology for space radiation applications. These exemplary features provide for an increase in UV detector lifetime, precision, sensitivity, and discrimination of radiation measurement. These features also allow the exemplary detector to provide improved performance for the mass, power (low power), noise (low noise), and volume (miniaturized geometry) requirements for future manned and unmanned deep space missions. The exemplary embodiment provides for a precise, rad-hard, thermally stable UV detector.

Data from the new, robust, compact, exemplary UV detector will allow improvements to existing radiation models that will impact spacecraft design and operation during planned missions. The exemplary detector will also allow deep space environments and outer planetary radiation belts to be better understood, especially for statistical variations of steady state and "storm" conditions. Closer to earth, the exemplary detector may be used in the study of cosmic radiation, which remains a concern for aircraft crews on intercontinental flights at very high altitudes. Cosmic radiation may also be a factor in environmental issues, such as large-scale global cloud cover.

A plurality of the exemplary UV detectors can also be used in combination (together) in a radiation detector system. For example, several of the exemplary detectors can be used simultaneously in a spherical-shaped type of detector system. A spherical configuration allows for Cherenkov light to be detected from all directions. Immersed in the space environment where radiation is omni-directional, Cherenkov light measurements taken by UV detectors over an entire spherical area at once can provide a significant improvement from interpolations carried out only along discrete axes.

As previously discussed, an exemplary UV detector arrangement can be used to detect Cherenkov light in a radiation detection operation, such as during a space mission. However, it should be understood that the exemplary UV detector can also be used in several other scenarios, environments, and conditions. For example, the exemplary UV detector can also find application in monitoring for fires, particularly fires with hydrocarbon flames that emit a UV component. The exemplary UV detector can also find application in spectrophotometry analysis. In still other applications, the exemplary UV detector can be used in monitoring during UV phototherapy. For example, the UV detector may be implemented for in vivo dosimetry, which can be useful in monitoring a patient's dose during treatment. Another application for the UV detector can be in microbial sterilization/disinfection processing.

As can be appreciated, the novel radiation detector apparatus of exemplary embodiments achieves at least one of the above stated objectives, eliminates difficulties encountered in the use of prior devices and systems, solves problems, and attains the desirable results described herein.

As demonstrated herein, the features and relationships of the exemplary embodiments result in an improved UV detector, in comparison to existing prior art UV detectors. Thus, embodiments employing the principles described can improve instrumentation performance for future space missions. Alternative embodiments of the UV detector have many useful applications beyond space science missions, as previously discussed.

It should be understood that detector fabrication and methods of using the exemplary detector as discussed above may also be practiced in steps of a different order, and/or with hardware elements in configurations which are different than those discussed. Thus, although the exemplary arrangements have been described based upon these preferred embodiments, certain modifications, variations, and alternative constructions are also within the spirit and scope of the principles described herein.

In the foregoing description, certain terms have been used for brevity, clarity, and understanding. However, no unnecessary limitations are to be implied therefrom because such terms are for descriptive purposes and are intended to be broadly construed. Moreover, the descriptions and illustrations herein are by way of examples and the invention is not limited to the details shown and described.

In the following claims, any feature described as a means for performing a function shall be construed as encompassing any means capable of performing the recited function, and shall not be limited to the particular means used for performing the function in the foregoing description, or mere equivalents.

Having described the features, discoveries and principles of the invention, the manner in which it is constructed and operated and the advantages and useful results attained, the new and useful structures, devices, elements, arrangements, parts, combinations, systems, equipment, operations, methods, processes, and relationships are set forth in the appended claims.

The invention claimed is:

1. An apparatus, comprising:
a zinc oxide (ZnO) substrate, wherein the apparatus does not include an underlying seed layer upon which the ZnO substrate is grown;
    wherein the substrate is sensitive to ultraviolet (UV) light,
        wherein UV light contacting the substrate is able to cause a resistivity change in the substrate; and
an arrangement of electrode fingers disposed on the ZnO substrate,
    wherein the arrangement is operable responsive to UV light contact with the substrate at a location between adjacent electrode fingers, to sense a difference corresponding to a change in substrate resistivity resulting from the UV light contact.

2. The apparatus according to claim 1 wherein the ZnO substrate comprises undoped ZnO.

3. The apparatus according to claim 2 wherein the ZnO substrate comprises single crystal undoped ZnO.

4. The apparatus according of claim 3 wherein the single crystal undoped ZnO comprises alternating planes of zinc and oxygen ions.

5. The apparatus according to claim 3 wherein the single crystal undoped ZnO comprises a crystal form having a 0001 orientation.

6. The apparatus according to claim 1 wherein the ZnO substrate comprises a semiconductor of ZnO having a band gap greater than 1.7 eV.

7. The apparatus according to claim 1 wherein the arrangement comprises interdigitated electrode fingers.

8. The apparatus according to claim 7
wherein the arrangement includes a first electrode comprising a first set of fingers,
wherein the arrangement includes a second electrode comprising a second set of fingers,
    wherein fingers from the second set alternate in parallel with fingers from the first set, which forms the interdigitated electrode fingers.

9. The apparatus according to claim 8
wherein the first set of fingers extend from a first contact pad,
wherein the second set of fingers extend from a second contact pad,
wherein the first electrode, the second electrode, the first contact pad, and the second contact pad are formed by conductive metal applied onto the substrate.

10. The apparatus according to claim 1 wherein the arrangement and the ZnO substrate are part of a sensor of a UV light detector,
    wherein the detector has a response time ≤2 nano seconds.

11. The apparatus according to claim 10 further comprising a measurement component of the detector,
    wherein the measurement component is operable to detect a change in at least one of voltage or resistance, resulting from the change in substrate resistivity.

12. The apparatus according to claim 11 wherein the measurement component comprises a bridge circuit,
    wherein the bridge circuit allows for measurement of a difference in at least one of voltage drop or change in resistance resulting from the change in substrate resistivity,
    wherein the sensor is operable as a resistive sensor as part of the bridge circuit.

13. The apparatus according to claim 10 wherein the sensor has an active area that is ≥1 mm$^2$.

14. An apparatus comprising:
a solid-state photodetector operable to detect a Cherenkov light emission within 2 ns,
wherein the photodetector includes a circuit,
    wherein the circuit includes a sensor component,
        wherein the sensor component is operable to sense UV light,
        wherein the sensor component includes interdigitated electrode fingers on a non-epitaxial substrate constructed from a wide band gap photosensitive semiconductor, wherein the sensor component does not include a seed layer upon which the non-epitaxial substrate is grown;
        wherein the semiconductor comprises a metal oxide configured to undergo a change in resistance responsive to exposure to UV light,
    wherein the circuit includes a measurement component,
        wherein the measurement component is electrically connected to the sensor component,
        wherein the measurement component is operable to measure data indicative of the change in resistance.

15. The apparatus according to claim 14 wherein the metal oxide comprises zinc oxide (ZnO).

16. The apparatus according to claim 15 wherein the metal oxide comprises undoped ZnO.

17. The apparatus according to claim 16 wherein the metal oxide comprises a single crystal undoped ZnO.

18. The apparatus according to claim 17 wherein the single crystal undoped ZnO comprises alternating planes of zinc and oxygen ions.

19. The apparatus according to claim 14 wherein the circuit comprises a bridge circuit configured to measure a voltage difference corresponding to the change in resistance.

20. An apparatus comprising:
a UV photodetector operable to detect Cherenkov light,
wherein the photodetector includes a semiconductor substrate,
    wherein the semiconductor substrate comprises single crystal undoped zinc oxide (ZnO), wherein the apparatus does not include an underlying seed layer upon which the semiconductor substrate is grown,
    wherein the ZnO comprises alternating planes of zinc and oxygen ions, wherein the photodetector includes interdigitated finger electrodes and contact pads of conductive metal applied on the semiconductor substrate such that UV light is directly incident on the semiconductor substrate,
    wherein the photodetector is configured to operate as a resistive sensor for a bridge circuit, wherein the photodetector has a response time of ≤2 nano seconds, wherein the response time=$d^2/\mu V$, where d corresponds to spacing length between interdigitated fingers of the electrodes, μ corresponds to electrode mobility of the substrate, and V corresponds to voltage applied to the electrodes.

\* \* \* \* \*